US009286968B2

(12) United States Patent
Osada et al.

(10) Patent No.: US 9,286,968 B2
(45) Date of Patent: Mar. 15, 2016

(54) SEMICONDUCTOR INTEGRATED CIRCUIT DEVICE INCLUDING SRAM CELL ARRAY AND A WIRING LAYER FOR SUPPLYING VOLTAGE TO WELL REGIONS OF SRAM CELLS PROVIDED ON A REGION EXTERIOR OF SRAM CELL ARRAY

(75) Inventors: Kenichi Osada, Kawasaki (JP); Masataka Minami, Hino (JP); Shuji Ikeda, Koganei (JP); Koichiro Ishibashi, Warabi (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/616,435

(22) Filed: Sep. 14, 2012

(65) Prior Publication Data

US 2013/0049131 A1     Feb. 28, 2013

Related U.S. Application Data

(63) Continuation of application No. 12/821,329, filed on Jun. 23, 2010, now Pat. No. 8,482,083, which is a continuation of application No. 12/348,524, filed on Jan. 5, 2009, now Pat. No. 7,781,846, which is a
(Continued)

(30) Foreign Application Priority Data

May 12, 1999   (JP) ..................................... 11-130945
Apr. 27, 2000  (JP) ................................. 2000-132848

(51) Int. Cl.
*H01L 29/76*    (2006.01)
*H01L 27/11*    (2006.01)
*G11C 11/412*   (2006.01)

(52) U.S. Cl.
CPC .............. *G11C 11/412* (2013.01); *H01L 27/11* (2013.01); *H01L 27/1104* (2013.01); *Y10S 257/904* (2013.01)

(58) Field of Classification Search
CPC ............................ H01L 27/1104; H01L 27/11
USPC ......................... 257/379, 393, 401, 903, 904
See application file for complete search history.

(56) References Cited

U.S. PATENT DOCUMENTS 5,072,286 A     12/1991  Minami et al.
5,166,902 A *   11/1992  Silver ............................ 365/182
(Continued)

FOREIGN PATENT DOCUMENTS

JP       05-090538     4/1993
JP         590538      4/1993
(Continued)

OTHER PUBLICATIONS

JP Office Action and English Translation dated Jun. 26, 2012.
(Continued)

*Primary Examiner* — Ori Nadav
(74) *Attorney, Agent, or Firm* — Gregory E. Montone; Roberts Mlotkowski Safran & Cole, P.C.

(57) ABSTRACT

Prior known static random access memory (SRAM) cells required that a diffusion layer be bent into a key-like shape in order to make electrical contact with a substrate with a P-type well region formed therein, which would result in a decrease in asymmetry leading to difficulty in micro-patterning. To avoid this problem, the P-type well region in which an inverter making up an SRAM cell is formed is subdivided into two portions, which are disposed on the opposite sides of an N-type well region NW1 and are formed so that a diffusion layer forming a transistor has no curvature while causing the layout direction to run in a direction parallel to well boundary lines and bit lines. At intermediate locations of an array, regions for use in supply power to the substrate are formed in parallel to word lines.

21 Claims, 15 Drawing Sheets

Related U.S. Application Data continuation of application No. 11/042,172, filed on Jan. 26, 2005, now Pat. No. 7,612,417, which is a continuation of application No. 10/606,954, filed on Jun. 27, 2003, now abandoned, which is a continuation of application No. 09/565,535, filed on May 5, 2000, now Pat. No. 6,677,649.

(56) References Cited

U.S. PATENT DOCUMENTS

| | | | |
|---|---|---|---|
| 5,515,313 | A | 5/1996 | Yamaguchi et al. |
| 5,594,270 | A | 1/1997 | Hiramoto et al. |
| 5,710,438 | A | 1/1998 | Oda et al. |
| 5,744,844 | A | 4/1998 | Higuchi |
| 5,780,328 | A | 7/1998 | Fukuda et al. |
| 5,831,285 | A | 11/1998 | Takeuchi et al. |
| 5,841,690 | A * | 11/1998 | Shibutani et al. ............. 365/149 |
| 5,844,837 | A | 12/1998 | Yoshikawa |
| 5,909,047 | A | 6/1999 | Takahashi |
| 5,930,163 | A | 7/1999 | Hara et al. |
| 5,965,922 | A | 10/1999 | Matsui et al. |
| 5,966,324 | A | 10/1999 | Wada et al. |
| 6,147,385 | A | 11/2000 | Kim et al. |
| 6,160,298 | A | 12/2000 | Ohkubo et al. |
| 6,340,825 | B1 | 1/2002 | Shibata et al. |
| 6,476,424 | B1 | 11/2002 | Ishida |
| 7,214,963 | B2 * | 5/2007 | Choi et al. ...................... 257/67 |

FOREIGN PATENT DOCUMENTS

| | | |
|---|---|---|
| JP | 05-235300 A | 9/1993 |
| JP | 07-045704 A | 2/1995 |
| JP | 07-086436 | 3/1995 |
| JP | 07-106438 | 4/1995 |
| JP | 08-037241 | 2/1996 |
| JP | 08-255842 | 10/1996 |
| JP | 09-027552 | 1/1997 |
| JP | 9-270468 A | 10/1997 |
| JP | 09-321152 | 12/1997 |
| JP | 10-172287 | 6/1998 |
| JP | 10-178110 | 6/1998 |
| JP | 10178110 | 6/1998 |
| JP | 11126827 | 5/1999 |
| JP | 2000174141 | 6/2000 |
| JP | 2000243858 | 8/2000 |
| JP | 2000243858 | 9/2000 |
| KR | 0142038 B | 5/1995 |
| KR | 1995-023283 | 7/1995 |
| KR | 1996-0005602 | 2/1996 |
| KR | 1998-019133 | 8/1996 |
| KR | A-1997-0067369 | 10/1997 |
| KR | 1999-4944 | 1/1999 |

OTHER PUBLICATIONS

JP Office Action and English Translation dated Oct. 2, 2012.
Office Action in JP 2012-186909, mailed Jan. 21, 2014, (in Japanese, 2 pgs.); [English language translation, 2 pgs.].
Office Action in JP 2013-061363, mailed Apr. 1, 2014, (in Japanese, 2 pgs.); [English language translation, 3 pgs•].
Office Action in JP2012-186906, mailed May 7, 2014) in Japanese, 2 pgs.); [English language translation, 2 pgs.].
Japanese Office Action dated Nov. 26, 2015 in related JP Application No. 2014-161090, 5 pages.
Office Action in Japanese Counterpart Application H00008645 dated Jul. 27, 2014, 3 pages.

* cited by examiner

| | |
|---|---|
| ▨ DIFFUSION LAYER | ◪ FIRST VIA LAYER |
| ☐ POLYSILICON LAYER | ☐ SECOND METAL LAYER |
| ▩ CONTACT LAYER | ◩ SECOND VIA LAYER |
| ◩ FIRST METAL LAYER | ⊡ THIRD METAL LAYER |

- ▨ DIFFUSION LAYER
- ☐ POLYSILICON LAYER
- ▧ CONTACT LAYER
- ▨ FIRST METAL LAYER
- ▨ FIRST VIA LAYER
- ☐ SECOND METAL LAYER
- ▨ SECOND VIA LAYER
- ⌐ ¬ THIRD METAL LAYER
- ⊠ FIRST VIA LAYER, SECOND VIA LAYER, THIRD VIA LAYER
- ⌐ ¬ FOURTH METAL LAYER

- ⬚ DIFFUSION LAYER
- □ POLYSILICON LAYER
- ▨ CONTACT LAYER
- ◨ FIRST METAL LAYER
- ⬚ FIRST VIA LAYER
- □ SECOND METAL LAYER
- ◩ SECOND VIA LAYER
- ⌐ ⌐ THIRD METAL LAYER
- ⌐ ⌐ AREA WHERE POLYSILICON AND DIFFUSION ARE CONNECTED

- ▨ DIFFUSION LAYER
- ☐ POLYSILICON LAYER
- ▩ CONTACT LAYER
- ▨ LOCAL INTERCONNECT
- ◩ FIRST METAL LAYER
- ◪ FIRST VIA LAYER
- ☐ SECOND METAL LAYER

SEMICONDUCTOR INTEGRATED CIRCUIT DEVICE INCLUDING SRAM CELL ARRAY AND A WIRING LAYER FOR SUPPLYING VOLTAGE TO WELL REGIONS OF SRAM CELLS PROVIDED ON A REGION EXTERIOR OF SRAM CELL ARRAY

This application is a Continuation Application of application Ser. No. 12/821,329, filed Jun. 23, 2010 now U.S. Pat. No. 8,482,083, which, in turn, is a Continuation Appln. of application Ser. No. 12/348,524, filed Jan. 5, 2009 (now U.S. Pat. No. 7,781,846), which, in turn, is a Continuation of application Ser. No. 11/042,172, filed Jan. 26, 2005 (now U.S. Pat. No. 7,612,417), which, in turn, is a Continuation of application Ser. No. 10/606,954, filed Jun. 27, 2003 (now abandoned), and which, in turn, is a Continuation of application Ser. No. 09/565,535, filed May 5, 2000 (now U.S. Pat. No. 6,677,649); and the entire disclosures of which are hereby incorporated by reference.

BACKGROUND OF THE INVENTION

The present invention relates generally to semiconductor integrated circuit devices and, more particularly, to layout schemes of static random access memory (SRAM) cells. The invention also relates to semiconductor memory devices using such cells.

One-port SRAM cells with complementary metal oxide semiconductor (CMOS) configurations are typically designed so that each cell consists essentially of six separate transistors. An exemplary layout of such cells has been disclosed, for example, in JP-A-10-178110 (laid open on Jun. 30, 1998).

In the previously known SRAM cell layout, a semiconductive well region of P type conductivity with inverters formed therein is subdivided into to subregions, which are disposed on the opposite sides of an N-type well region while permitting a well boundary line to extend in a direction parallel to the bit lines.

The quest for higher integration and ultra-fine patterning techniques in modern memory devices requires an optical exposure apparatus or equipment to decrease the wave length of the beams used therein. To this end, the equipment is designed to employ exposure beams of shorter wavelengths, which have advanced from G line to I line, and then further to excimer lasers. Unfortunately, the requirements for micro-patterning architectures have grown more rapidly than technological advance in the trend of shortening wavelengths in such equipment. In recent years, it has been strictly required that micropatterning be done with the minimum device-feature length that shrinks to less than or equal to the wavelength of the exposure beam used. This minimum feature length shrinkage would result in a layout of IC components—particularly, memory cells—becoming more complicated in planar shape, which necessitates the use of irregular polygonal layout patterns including key-shaped components, in order to achieve the intended configuration of an on-chip circuitry with enhanced accuracy. This makes it impossible, or at least very difficult, to microfabricate ultrafine layout patterns while disadvantageously serving as the cause of the destruction of the symmetry of memory cells.

Regrettably, the prior art approach is associated with a need to curve or bend a diffusion layer into a complicated key-like shape for the purpose of making electrical contact with a substrate of the P-type well region. Thus, the prior art suffers from the problem of the degradation of the symmetrization of the cell layout pattern, making the successful achievement of microfabrication architectures for higher integration densities difficult.

SUMMARY OF THE INVENTION

In accordance with one aspect of the present invention, a semiconductor device is provided which comprises a first inverter including a first N-channel metal oxide semiconductor MOS transistor, and a first channel MOS transistor, a second inverter including a second N-channel MOS transistor and a second P-channel MOS transistor with an input terminal being connected to an output terminal of the first inverter and with an output terminal being connected to an input terminal of said first inverter, a third N-channel MOS transistor having a source connected to the output terminal of said first inverter, a drain connected to a first bit line, and also a gate connected to a word line, and a fourth N-channel MOS transistor having a source connected to the output terminal of said second inverter, a drain connected to a second bit line, and a gate connected to a word line, wherein the first and third N-channel MOS transistors are formed in a first P-type well region, wherein the diffusion layer has no curved or bent portions, while letting the direction of the layout be parallel to the boundary with respect to the first N-well region with the first and second P-channel MOS transistors formed therein, and wherein said second and fourth N-channel MOS transistors are formed in the second P-type well region, whose diffusion layer has no bent portions, while letting the layout direction be parallel to the boundary with respect to the first N-well region with the first and second P-channel MOS transistors formed therein.

The diffusion layer is arranged to have its outer shape, which mainly consists of straight line segments including the longest straight line portion, which lies parallel to the boundary with respect to the first N-well region with the first and second P-channel MOS transistors formed therein, and simultaneously in the case of defining a straight line acting as the center line extending parallel to such a boundary, the longest line portion is in linear symmetry with said center line; the second and fourth N-channel MOS transistors are formed in the second P-well region, whose diffusion layer is mainly arranged by straight line segments including its longest straight line portion that is parallel to the boundary with respect to the first N-well region with the first and second P-channel MOS transistors formed therein while allowing, when defining a straight line for use as the center line extending parallel to such a boundary, the line portion to be linearly symmetrical to the center line. At this time, in the case of employing the linear symmetrization scheme, complete linear symmetry will not always be required. Alternatively, slight nonsymmetry may also be permissible on a case-by-case basis. This nonsymmetry results from modifying the diffusion layer to have a shape in which its portions on the right and left sides of the center line are substantially the same in area as each other, by way of example.

In accordance with another aspect of this invention, a first polycrystalline silicon lead layer for use as the gate of said third N-channel MOS transistor and a second polycrystalline silicon lead layer for use as the gate of said first P-channel MOS transistor, and also as the gate of said first N-channel MOS transistor, are disposed in parallel to each other, wherein a third polycrystalline silicon lead layer for use as the gate of said fourth N-channel MOS transistor, and a fourth polycrystal-line silicon lead layer for use as the gate of said second N-channel MOS transistor, and also as the gate of said second P-channel MOS transistor are disposed in parallel to each other, and wherein the first and third polycrystalline silicon lead layers are connected via a contact to a second layer which serves as a metal lead layer constituting the word lines.

In accordance with another aspect of the invention, the input terminal of said first inverter and the output terminal of said second inverter may be electrically connected together at a contact, whereas the input terminal of said second inverter and the output terminal of said first inverter are electrically connected together at a contact.

In accordance with yet another aspect of the invention, a power supply line connected to the first and second bit lines, the sources of said first and second P-channel MOS transistors, and a ground line connected to the sources of said first and second N-channel MOS transistors may be formed of a third layer serving as a metal lead layer lying parallel to a diffusion layer.

In accordance with a still another aspect of the invention, the first bit line formed of said third layer serving as a metal lead layer may be arranged so that it is between a power supply line formed of said third layer serving as a lead layer and a ground line as connected to the source of said first N-channel MOS transistor formed of said third layer serving as a metal lead layer whereas the second bit line formed of said third layer serving as a metal lead layer is between a power supply line formed of said third layer serving as a metal lead layer and a ground line as connected to the source of said second N-channel MOS transistor formed of said third layer serving as a metal lead layer.

In accordance with another aspect of the invention, the first and second bit lines and a power supply line connected to the sources of said first and second P-channel MOS transistors may be formed of a second layer serving as a metal lead layer, wherein word lines are formed of a third layer of metal lead layer, and wherein a ground line connected to the sources of said first and second N-channel MOS transistors is formed of the third layer and second layer serving as a metal lead layer.

In accordance with a still another aspect of the invention, memory cells are laid out into the form of an array, wherein contacts to a substrate of a P-type well region and a contact to a substrate of an N-type well region are linearly disposed within the array and at upper and lower portions of the array in a direction parallel to the word lines. Although the above is an example which causes two separate P-well regions to be disposed on the opposite sides of an N-well region, two N-well regions may be disposed on the opposite sides of a P-well region when the need arises.

In accordance with yet another aspect of the invention, a semiconductor device is provided which comprises a plurality of memory arrays, each including an array of memory cells having at least an N-type well region and a P-type well region, and at least one intermediate region between the memory arrays, wherein the N-type well region and P-type well region define therebetween a boundary with at least one straight line portion, and wherein a diffusion layer is formed in both the N-type well region and the P-type well region to have a planar shape of either (1) a rectangle having long sides extending parallel to said straight line portion, or (2) a shape resulting from letting a plurality of rectangles having long sides extending parallel to the straight line portion be combined together via respective short sides thereof; or alternatively, (1) a rectangle having long sides parallel to said straight line portion, or (2) a shape resulting from letting a plurality of rectangles having long sides parallel to said straight line portion be combined together, causing them to extend in the direction of the straight line.

At least in the memory array regions, bit lines are laid out in a direction parallel to the straight line portion, whereas word lines are disposed in a direction perpendicular to the straight portion. Preferably, in the intermediate region, at least one type of electrical lead is railed in a direction at right angles to the straight portion, and a lead (e.g. contact) is also formed with the purpose of making electrical contact between a power supply voltage lead and the diffusion layer as formed in the N-well region or P-well region. This lead may include a power supply lead, ground lead, or other potential leads.

The invention is particularly useful for those semiconductor memory devices having static RAM memory cells each consisting essentially of six separate transistors.

DETAILED DESCRIPTION OF EMBODIMENTS

Several preferred embodiments of the semiconductor memory device in accordance with the present invention will be explained with reference to the accompanying drawings below.

Embodiment 1

Figure 1:
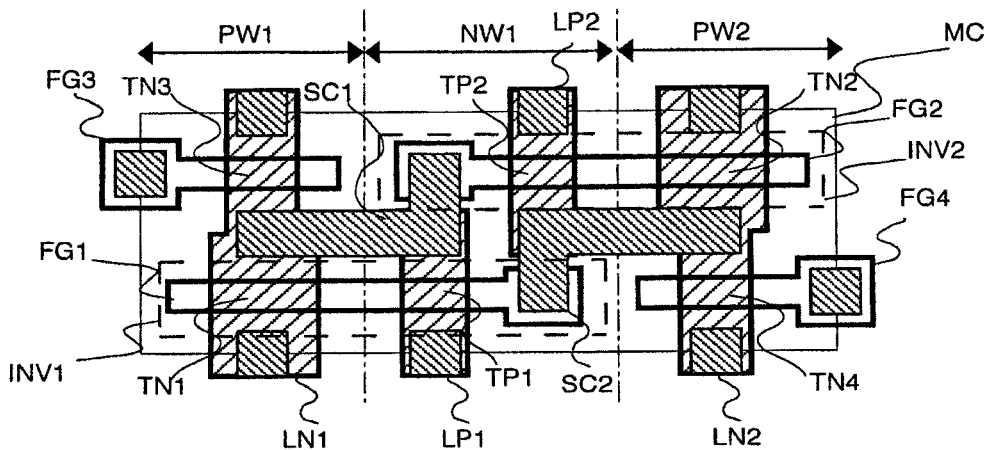
FIG. 1 is a diagram showing an SRAM cell in accordance with Embodiment 1 of the present invention, for explaining a layout pattern of those contacts for connection between MOS transistors and those for connecting between MOS transistors and metal lead layers.
Figure 2:
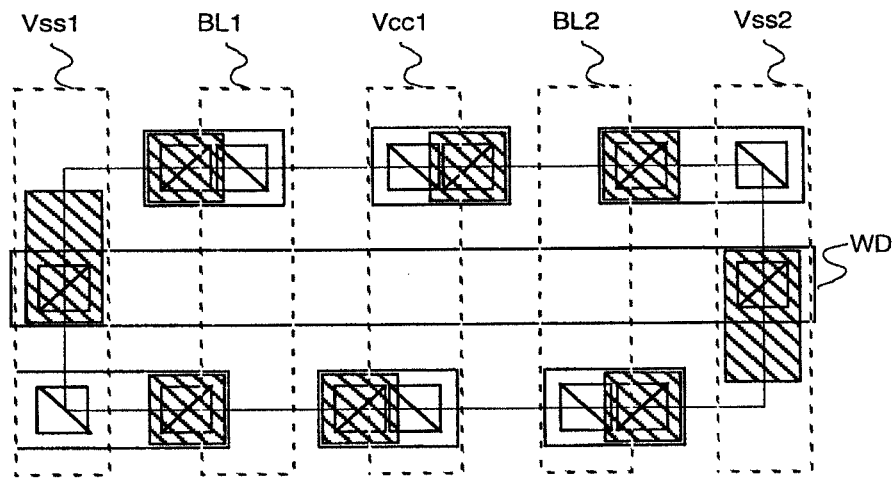
FIG. 2 is a diagram showing a layout of via holes of SRAM cells for connection between multilayered metal leads in accordance with Embodiment 1 of this invention.

Referring to FIGS. 1 and 2, SRAM cell layout MC embodying the invention. FIG. 1 illustrates well regions and diffusion layers plus a polycrystalline silicon interconnect lead layer, as well as contacts, all of which are formed in or over a semiconductor substrate FIG. 2 depicts a first layer serving as a metal lead layer, via holes 1, a second layer serving as a metal lead layer, via holes 2, and a third layer serving as a metal lead layer. Symbols used in FIGS. 1 and 2 are indicated at the lower part of FIG. 2.

An N-channel type MOS transistor TN1 formed in a P-type semiconductive well region PW1 and a P-channel type MOS transistor TP1 formed in an N-type well region NW1 constitute an inverter INV1. In addition, an N-channel MOS transistor TN2 formed in P-type well region PW2 and a P-channel MOS transistor TP2 formed in N-type well region NW1 constitute an inverter INV2.

An output node of the inverter INVL is electrically connected by a contact SC1 to an input node of the inverter INV2. An output of the inverter INV2 is electrically connected via a contact SC2 to an input of the inverter INV1.

An N-channel MOS transistor TN3 has a drain electrode connected to a bit line BL1, a source electrode connected to a drain of the N-channel MOS transistor TN1, and a gate electrode connected to a word line WD. Similarly, an N-channel MOS transistor TN4 has a drain electrode connected to a bit line BL2, a source electrode connected to a drain of the N-channel MOS transistor TN2, and a gate electrode connected to a word line WD.

The N-channel MOS transistor TN1 and the N-channel MOS transistor TN3 are formed over a diffusion layer LN1, whereas the N-channel MOS transistor TN2 and the N-channel MOS transistor TN4 are formed over a diffusion layer LN2. The P-channel MOS transistor TP1 is formed over a diffusion layer LP1, whereas the P-channel MOS transistor TP2 is formed over a diffusion layer LP2.

As the diffusion layers (LN1, LN2, LP1, LP2) are straight lines with no curved portions, any pattern correction at the folded portions is no longer necessary, resulting in the balance between nodes being improved. In case the memory cells are laid out into the form of an array, the diffusion layers become four separate straight lines extending parallel to the bit lines (BL1, BL2).

In addition, a polycrystalline silicon interconnect lead layer FG3 to be used the gate electrode of the N-channel MOS transistor TN3 and a polycrystalline silicon lead layer FG4 to be used as the gate electrode of the N-channel MOS transistor TN4 are connected to word lines WL, which are formed of the second metal lead layer in a vertical direction to the bit lines (BL1, BL2) A polycrystalline silicon interconnect lead layer FG1 to be used as the gate electrode of the N-channel MOS transistor TN1 and the P-channel MOS transistor TP1 and a polycrystalline silicon interconnect lead layer FG2 to be used as the gate electrode of the N-channel MOS transistor TN2 and the P-channel MOS transistor TP2, plus the polycrystalline silicon lead layers (FG3, FG4), are disposed in parallel to the word lines.

The N-channel MOS transistor TN1 has its source electrode connected to a ground potential line Vss1 that is formed of the third layer serving as a metal lead layer, whereas a source electrode of the N-channel MOS transistor TN2 is connected to a ground line Vss2 that is formed of the third layer serving as a metal lead layer. In addition, source electrodes of the P-channel MOS transistors (TP1, TP2) are connected to a power supply voltage line Vcc1 which is formed of the third layer serving as a metal lead layer.

The bit line BL1 is located midway between the power supply voltage line Vcc1 and ground line Vss1, whereas bit line BL2 is between the supply voltage line Vcc1 and ground line Vss2. This structure makes it possible to reduce cross-couple noises occurring between bit lines, which advantageously lowers voltages while increasing operation speeds.

In addition, it is considered that, in case a contact is formed on an $n^-$ layer through the partial cutaway of side spacers during the etching of contact holes, a leakage current from the contact via the $n^-$ layer to the substrate may be produced. When a contact is formed for connection between a polycrystalline silicon lead layer and a diffusion layer, the distance between the diffusion layer LP2 and polycrystalline silicon lead layer FG1 should be greater than the length of a side spacer to thereby eliminate the formation of an $n^-$ layer on the polycrystalline silicon lead layer FG1 side of the diffusion layer LP2, which in turn makes it possible to prevent a flow of leakage current.

Embodiment 2

Figure 3:
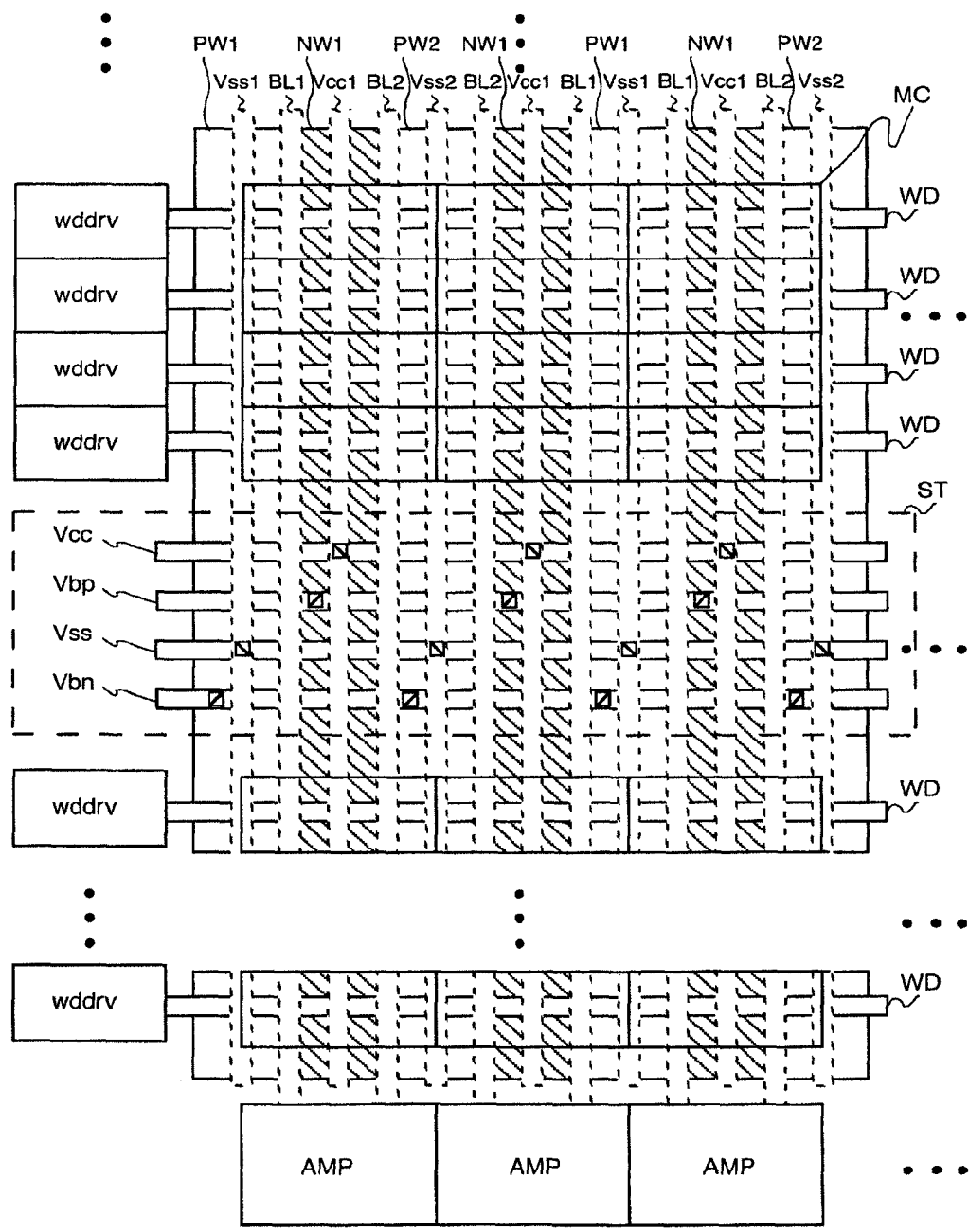
FIG. 3 is a diagram showing a layout of memory cells and their associated peripheral circuitry in accordance with Embodiment 2 of the invention.

Turning to FIG. 3, an exemplary case is shown where the memory cells MC of Embodiment 1 are laid out into the form of an array. Symbols used herein are the same as those indicated at the lower part of FIG. 2.

The memory cells MC are organized into an array of 256 rows and 128 columns, by way of example. In view of the fact that these memory cells in Embodiment 1 are shorter in length in the longitudinal direction of the bit lines, the total length of the 256 rows of memory cells along the bit lines is shorter than that of prior art devices, thus increasing resultant operation speeds. Neighboring memory cells MC are disposed in linear symmetry with respect to a "y" axis whereas upper and lower adjacent memory cells MC are in linear symmetry with an "x"

axis. In addition, specified regions ST for use in supplying more than one power supply voltage to the substrate are formed at the intermediate part of the array in such a manner that the regions ST extend parallel to word lines WD. One example is that the regions ST are laid out in units of 32-row groups. Another example is that regions ST are disposed in units of 64-row groups.

An electrical lead Vbn for supplying a voltage potential to the P-well regions (PW1, PW2) and a lead Vbp for supplying a voltage to the N-well region NW1 are formed to lie parallel to word lines. The lead Vbn may be coupled to the ground potential Vss or, alternatively, any voltage may be applied thereto which is potentially different from the ground Vss. The lead Vbp may be coupled to the power supply voltage Vcc or, alternatively, any voltages potentially different from the Vcc may be applied thereto.

Note that in each region ST, a power supply voltage line Vcc for potentially "reinforcing" a power supply voltage line Vcc1 is formed in parallel to word lines while, allowing a ground potential line Vss for potentially reinforcing ground potentials (Vss1, Vss2) to be formed in parallel to the word lines.

Also note that the ground lines (Vss1, Vss2) are disposed in a direction perpendicular to the word lines WD, whereby upon selecting a single word line a voltage potential is supplied from the pair of ground lines to a respective one of those memory cells operatively associated with this selected word line so that any possible noises occurring at such voltage lines are reduced, thereby advantageously speeding an access operation while potentially reducing any voltages concerned.

Furthermore, the memory cells MC used are great in width in the word line direction so that the layout design of sense amplifiers AMP is made easier, thereby avoiding the need to day out one sense amplifier for two adjacent columns of memory cells, which in turn makes it possible to permit one sense amplifier to be laid out at each column. Additionally, a word line driver circuit wddrv becomes flat in layout as compared to previously prior known ones.

Embodiment 3

Figure 4:
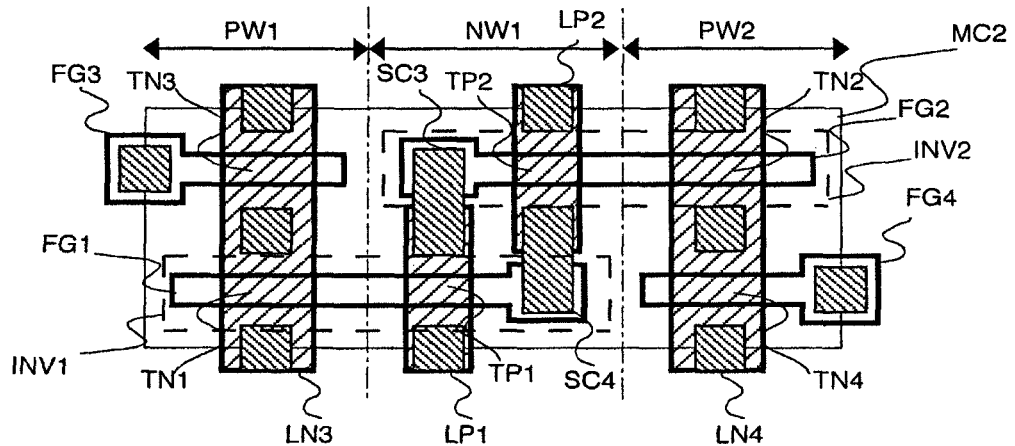
FIG. 4 is a diagram showing an SRAM cell in accordance with Embodiment 3 of the invention, for explaining a layout of those contacts for connection between MOS transistors and those for connection between MOS transistors and metal lead layers.
Figure 5:
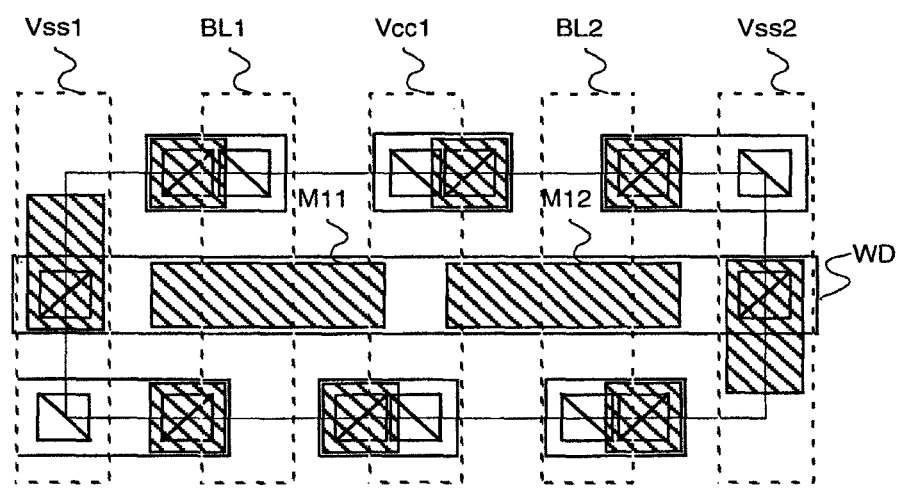
FIG. 5 is a diagram showing a layout of via holes of SRAM cells for connection between multilayered metal leads in accordance with Embodiment 3 of the invention.

FIGS. 4 and 5 show a SRAM cell layout MC2 in accordance with Embodiment 3. Symbols as used in FIGS. 4-5 are the same as those in FIG. 2. Memory cell MC2 of Embodiment 3 is similar to the memory cell MC of Embodiment 1, with the exception that, as compared to Embodiment 1, in which the diffusion layer (LN1, LN2) is formed into a "T"-like planar shape, which resembles a Japanese battledore plate called "hagoita," the diffusion layer (LN3, LN4) of Embodiment 4 is of a rectangular shape, and the contacts (SC1, SC2) are replaced with contacts (SC3, SC4) in the first layer serving as metal lead layers (M11, M12).

To attain stability, memory cells are typically designed so that the gate width of the N-channel MOS transistors (TN1, TN2) is one and a half times greater than that of the N-channel MOS transistors (TN3, TN4) However, in this case, the shape of the diffusion layers resembles a T-like planar shape, as shown in Embodiment 1, which in turn requires extra techniques, including pattern correction procedures such as optical proximity effect correction (OPC) processes. Additionally, this would result in the degradation of the balance between transistors. In contrast, Embodiment 3 is such that the diffusion layers (LN3, LN4) are designed to have a rectangular shape whereby the micro-patterning required becomes easier while at the same time enabling an improvement in balance between transistors. Note, however, that the resultant gate width ratio becomes as large as 1.0 time, which in turn requires that the so-called cell ratio be increased by making different drivabilities therebetween. This is attainable by letting the N-channel MOS transistors (TN3, TN4) be greater in oxide film thickness than the N-channel MOS transistors (TN1, TN2), by increasing the gate length thereof, or by increasing the threshold value, or by lowering the impurity concentration of lightly-doped drain regions for relaxation of electric fields.

In addition, Embodiment 3 is arranged to employ a contact SC3 and a first layer serving as a metal lead layer M11 in place of the contact SC1 used in Embodiment 1 for connection between the output of the inverter INVL and the input of the inverter INV2. With such an arrangement, any curved or bent contacts are no longer necessary, thereby avoiding the need for pattern correction (OPC) or the like.

Embodiment 4

Figure 6:
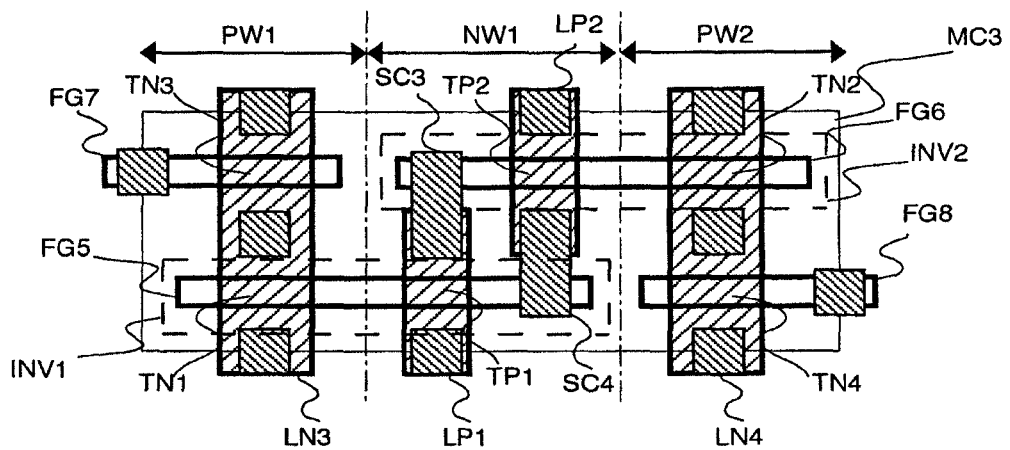
FIG. 6 is a diagram showing an SRAM cell in accordance with Embodiment 4 of the invention, for explaining a layout of those contacts for connection between MOS transistors and those for connection between MOS transistors and metal lead layers.
Figure 7:
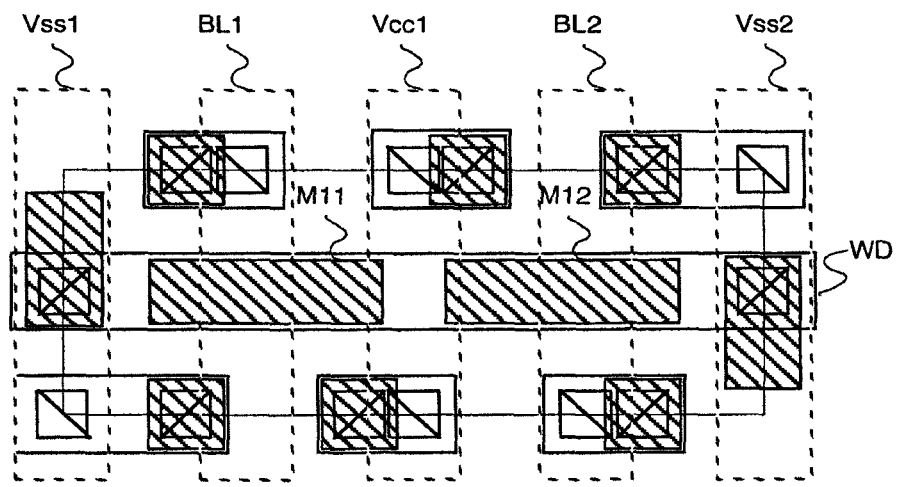
FIG. 7 is a diagram showing a layout of via holes of SRAM cells for connection between multilayered metal leads in accordance with Embodiment 3 of the invention.

FIGS. 6 and 7 show an SRAM cell layout MC3 in accordance with Embodiment 4. The symbols used in FIGS. 6-7 are the same as those in FIG. 2. Memory cell MC3 of Embodiment 4 is similar to the memory cell MC2 of Embodiment 3, except that the polycrystalline silicon lead layers (FG5, FG6, FG7, FG8) are designed to have a rectangular planar shape. With this cell, any bent/folded portions are absent, thus removing the need for any additional pattern correction procedures including OPC processes, which in turn improves the balance between transistors.

Embodiment 5

Figure 8:
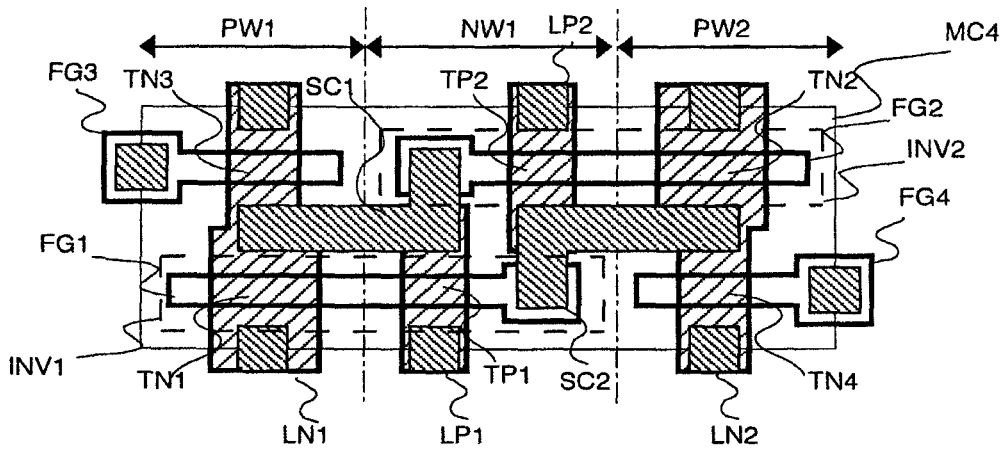
FIG. 8 is a diagram showing an SRAM cell in accordance with Embodiment 5 of the invention, for explaining a layout of those contacts for connection between MOS transistors and those for connection between MOS transistors and metal lead layers.
Figure 9:
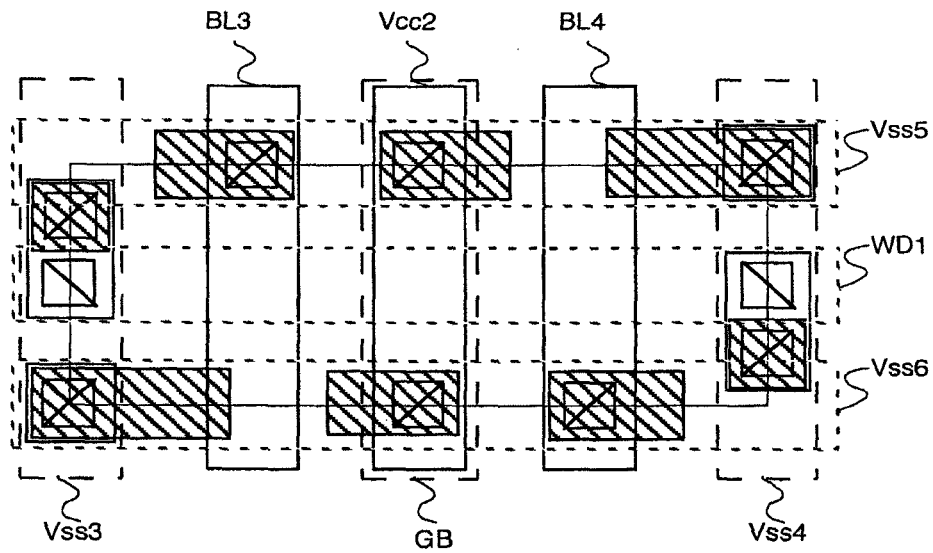
FIG. 9 is a diagram showing a layout of via holes of SRAM cells for connection between multilayered metal leads in accordance with Embodiment 5 of the invention.

FIGS. 8 and 9 show an SRAM cell layout MC4 in accordance with Embodiment 5. An explanation of the symbols used in FIGS. 8 and 9 is given at the lower part of FIG. 8. Memory cell MC4 of Embodiment 5 is different in lead structure from the memory cell MC of Embodiment 1.

Bit lines (BL3, BL4) and power supply line Vcc2 are formed by the use of a second layer serving as a metal lead layer. A word line WD1 and ground lines (Vss5, Vss6) are formed using a third layer serving as a metal lead layer in a perpendicular direction to the bit lines. Ground lines (Vss3, Vss4) are formed using a fourth layer serving as a metal lead layer in a direction parallel to the bit lines.

A global bit line GB is the electrical interconnect lead that is used in the case that the bit lines are of a hierarchical configuration. The global bit line GB and bit lines (BL3, BL4) are shielded by the third layer serving as a metal lead layer, thus enabling the prevention of any possible cross-couple noises. Additionally, the use of ground lines (Vss3, Vss4) makes it possible to prevent the occurrence of crosscouple noises between global bit lines GB.

Embodiment 6

Figure 10:
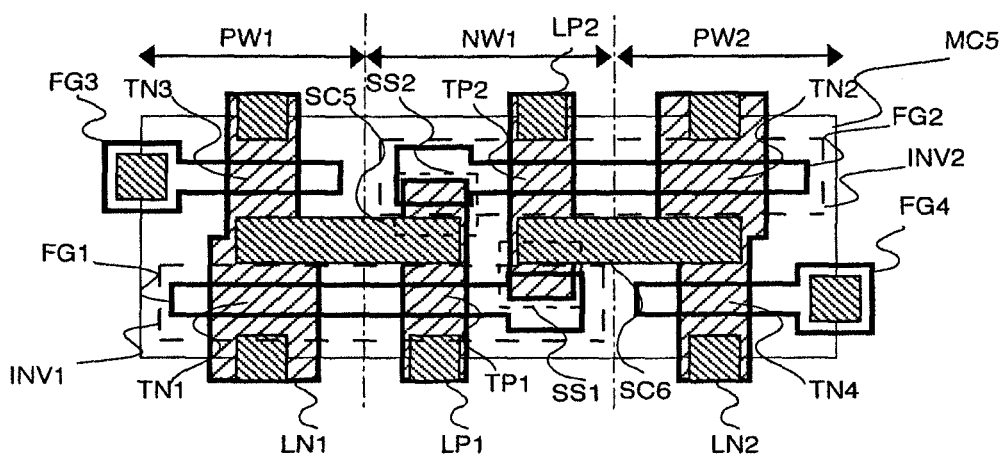
FIG. 10 is a diagram showing an SRAM cell in accordance with Embodiment 6 of the invention, for explaining a layout of those contacts for connection between MOS transistors and those for connection between MOS transistors and metal lead layers.
Figure 11:
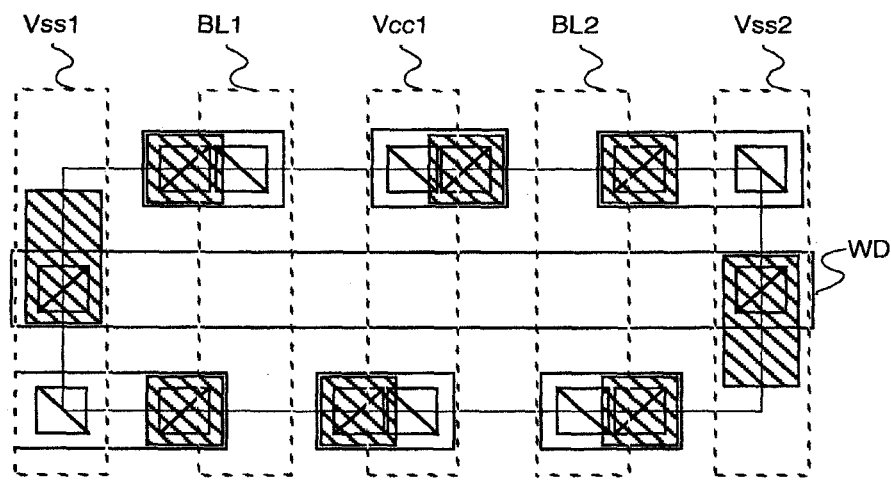
FIG. 11 is a diagram showing a layout of via holes of SRAM cells for connection between multilayered metal leads in accordance with Embodiment 6 of the invention.

FIGS. 10 and 11 show an SRAM cell layout MC5 in accordance with embodiment 6. An explanation of the symbols used in FIGS. 10-11 is given at lower part of FIG. 11. Memory cell MC5 of Embodiment 6 is different from the memory cell MC of Embodiment 1 in the structure of the so-called three-layered contacts, each of which is for connection between a gate electrode and its associated diffusion layer.

Although in Embodiment 1 a gate electrode is connected to a diffusion layer via "L"-like contacts SC1 and SC2, Embodiment 6 is arranged so that the gate electrode is connected to the diffusion layer via silicide in connect regions SS1 and SS2. This makes it unnecessary to bend or curve the individual contact into the L-like shape in order to connect the gate electrode to the diffusion layer, which in turn makes it possible to provide "I"-like rectangular contacts SC5, SC6. No folded/bent portions are present in the contacts used, which eliminates the need for pattern correction (OPC).

FIGS. 12a-12F show a practical example of the process steps which can be used in manufacturing a device structure employing the connect regions SS1 and SS2, each for connection between a gate electrode and a diffusion layer associated therewith via silicide. Note here that FIGS. 12a-12f are cross-sectional views, each indicating a profile as taken along line A-Al in FIG. 10, with its right side corresponding to the side "A" and with its left side corresponding to "Al."

Figure 12A:
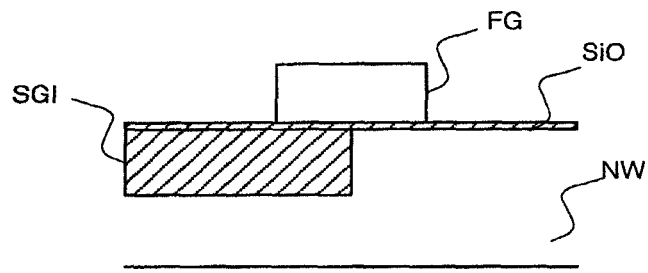
FIGS. 12a to 12f are diagrams illustrating in cross-section some of major process steps in the manufacture of the semiconductor device in accordance with Embodiment 6 of the invention.

Fabricate a gate electrode FG made of a chosen polycrystalline silicon material (see FIG. 12a).

Figure 12B:
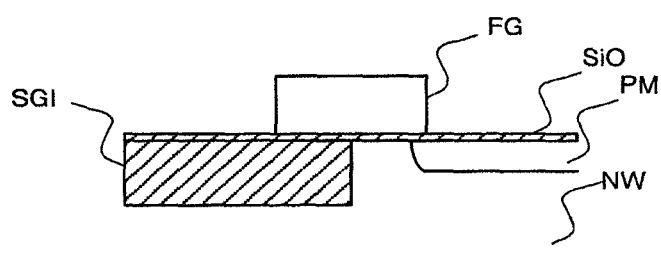

Form a heavily-doped diffusion layer PM of a specified conductivity type-here, a P type (FIG. 12b).

Figure 12C:
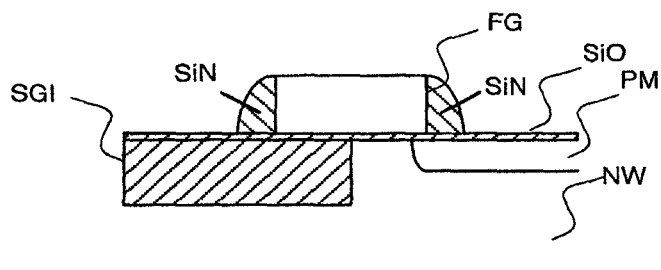

Form side spacers made of silicon nitride (SiN) by chemical vapor deposition (CVD) techniques on the side-walls of the resultant gate electrode FG (FIG. 12c).

Figure 12D:
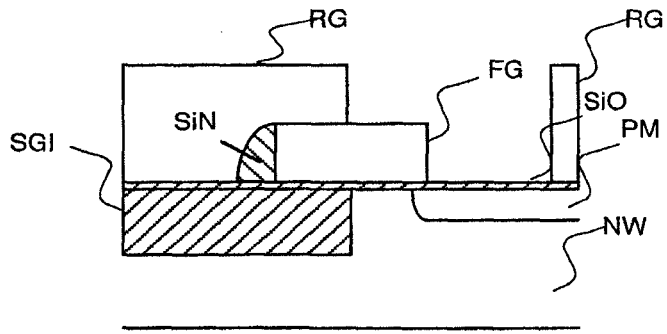
Figure 12E:
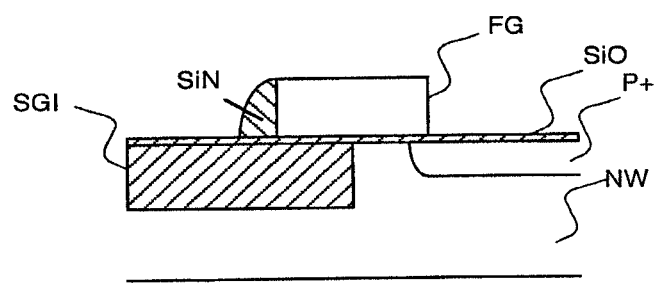

Make use of a resist RG to etch away only one of the SiN side spacers, which resides on an active region side under a prespecified condition that enables etching treatment of a silicon nitride film and oxide film at increased selectivity (FIG. 12d).

Fabricate a heavily-doped P (P+) type diffusion—layer P+.

Figure 12F:
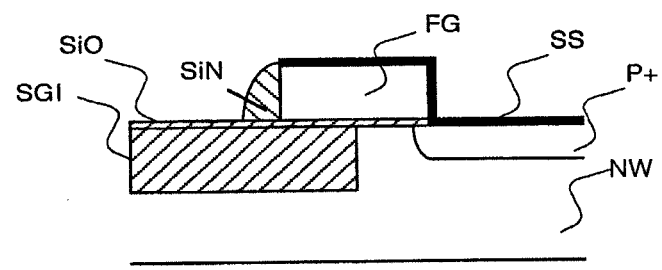

After having removed through etching a certain part of the oxide film SiO that lies in the active region that is not covered by any overlying gate electrode FG, deposit a high-melting-point metal such as refractory metal including, but not limited to, cobalt (Co); then, anneal the resultant structure to thereby selectively form silicide on the poly-silicon gate electrode and diffusion layer (FIG. 12f). At this time, a side-wall of the gate electrode and the diffusion layer are connected together by this silicide.

Embodiment 7

Figure 13:
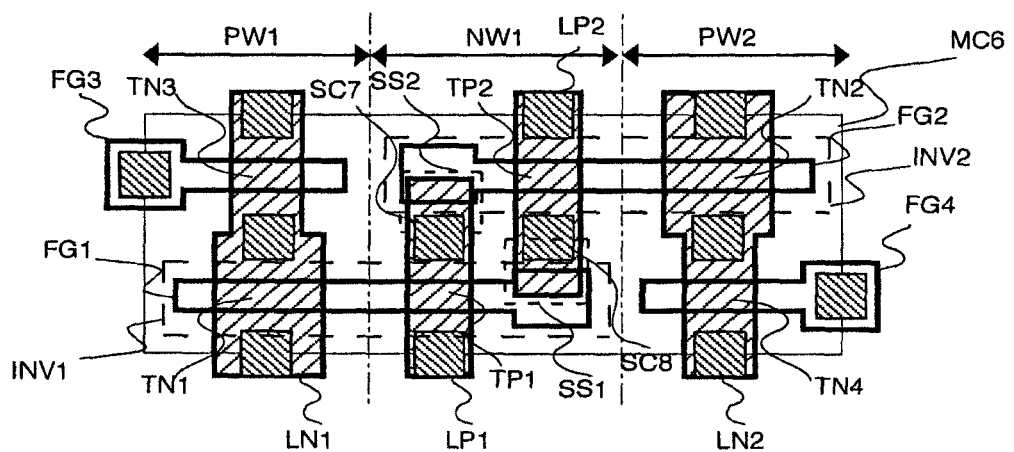
FIG. 13 is a diagram showing an SRAM cell in accordance with Embodiment 7 of the invention, for explaining a layout of those contacts for connection between MOS transistors and those for connection between MOS transistors and metal lead layers.
Figure 14:
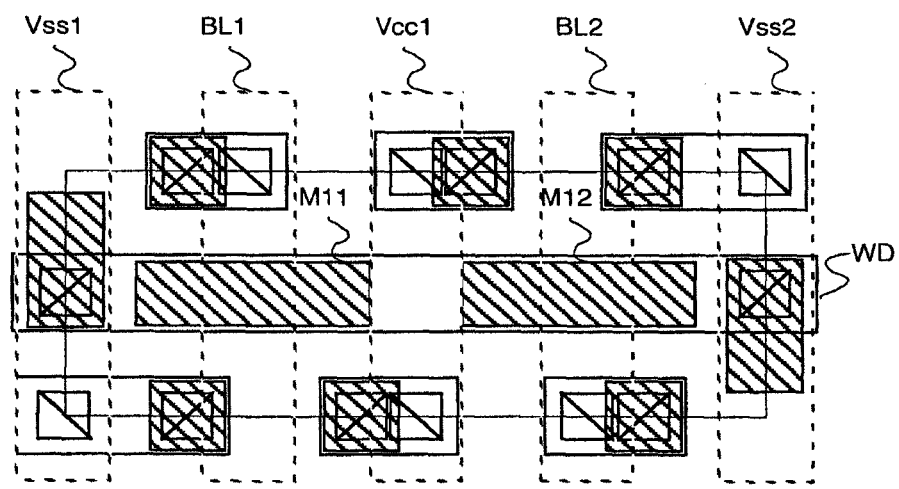
FIG. 14 is a diagram showing a layout of via holes of SRAM cells for use in connecting between multilayered metal leads in accordance with Embodiment 7 of the invention.

FIGS. 13 and 14 show an SRAM cell layout MC6 in accordance with Embodiment 7. An explanation of the symbols used in FIGS. 13-14 is the same as that given at the lower part of FIG. 11. Memory cell MC6 of Embodiment 7 is similar to the memory cell MC5 of Embodiment 6, with the contacts (SC5, SC6) being replaced with contacts (SC7, SC8) in the first layer serving as metal lead layers (M11, M12).

With Embodiment 7, all of the contacts used therein are capable of being designed to have a square planar shape, thus avoiding the need for pattern correction (OPC).

Embodiment 8

Figure 15:
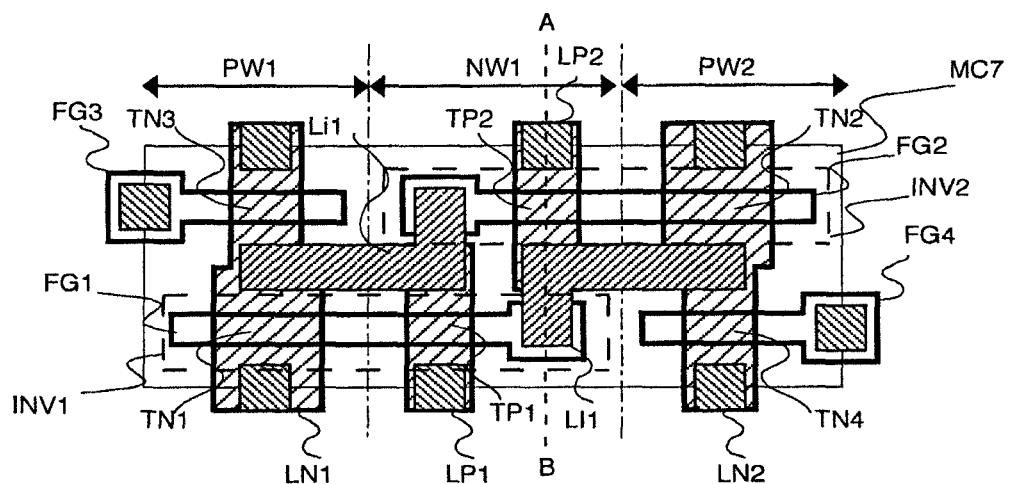
FIG. 15 is a diagram showing an SRAM cell in accordance with Embodiment 8 of the invention, for explaining a layout of those contacts for connection between MOS transistors and those for connection between MOS transistors and metal lead layers.
Figure 16:
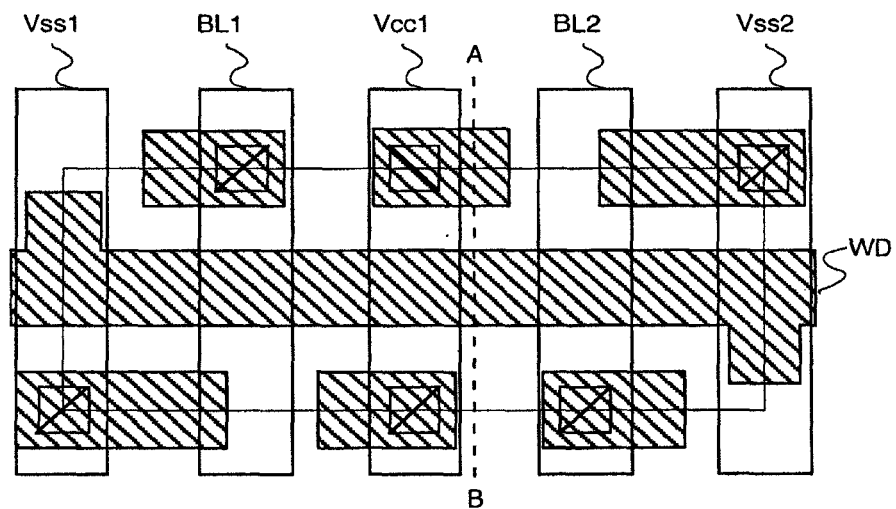
FIG. 16 is a diagram showing a layout of via holes of SRAM cells for connection between multilayered metal leads in accordance with Embodiment 8 of the invention.
Figure 17:
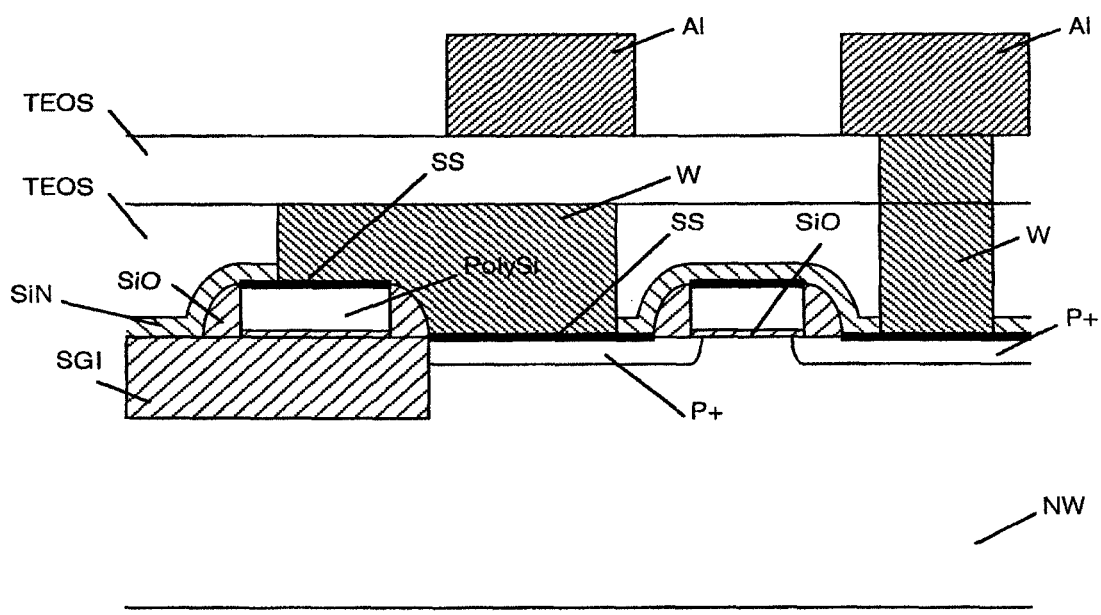
FIG. 17 is a sectional view of a semiconductor device in accordance with Embodiment 8 of the invention.

FIGS. 15 and 16 show an SRAM cell layout MC7 in accordance with Embodiment 8. An explanation of the symbols used in FIGS. 15-16 is given at the lower part of FIG. 16. Memory cell MC7 of Embodiment 8 is similar to the memory cell MC of Embodiment 1, with the contacts (SC1, SC2) being replaced with local interconnect nodes (LI1, LI2), and also with the word lines being modified in such a manner that these are formed in the first layer serving as a metal lead layer rather than in the second layer serving as a metal lead layer while also modifying the bit lines, power supply, and ground lines from the third layer serving as a metal lead layer to the second layer serving as a metal lead layer. FIG. 17 depicts a sectional view taken along line A-B of FIGS. 15-16.

Embodiment 1 suffers from limitations, such as an inability to dispose the first layer of metal leads over the contacts SC1 and SC2, due to the fact that these contacts SC1 and SC2 are formed of the same layer as the remaining contacts used. In contrast, Embodiment 8 is specifically arranged to employ the local interconnect nodes LI1 and LI2, formed in a separate layer from the contacts, thus making it possible to dispose the first layer serving as a metal lead layer at the upper part, which in turn makes it possible to reduce by one the requisite number of metal lead layers when compared to Embodiment 1.

Embodiment 9

A process flow of major steps in the manufacture of a three-layer contact section of Embodiment 9 is shown in FIGS. 18a-18f. Embodiment 9 is an example of the process for fabrication of the three-layer contact section as used in Embodiments 1, 3-5 and 8.

Modern LSIs in recent years are typically designed so that micropatterning is done to form contact holes by high-selectivity etching techniques with a silicon nitride film, or else used as a stopper to ensure that any unwanted over-etching occurs at filed oxide films, even when contacts are offset in position from diffusion layers and/or gate electrodes due to the presence of possible alignment errors during photolithographical patterning processes. In such cases, gate electrodes are formed to have reduced electrical resistivities by the use of the so-called silicide processes. It is possible to obtain the intended electrical conduction between a contact lying over a gate electrode and a contact overlying a diffusion layer, even when the both contacts are fabricated at a time due to the fact that the contact holes required are fabricated after the completion of a procedure having the steps of forming silicide through exposure of selected portions overlying diffusion layers and gate electrodes after having formed such diffusion layers, depositing thereover a silicon nitride film for use as an etching stopper, and then further depositing thereover an interlayer dielectric film. On the contrary, in the case of either the traditionally widely employed polycide gate electrodes or the polymetal gate electrodes that have been developed and announced recently, residual portions of an insulative film such as an oxide film can overlie gate electrodes thereby preventing the exposure of these gate electrodes prior to deposition of a silicon nitride film acting as the etch stopper. Accordingly, whenever an attempt is made to form the intended contacts through the deposition of a silicon nitride film thereover, the oxide film behaves to partly reside at the bottom of a respective one of those contacts overlying the gate electrodes, which makes it impossible, or at least very difficult to provide the electrical conduction required. Embodiment 9 is for enabling the achievement of electrical conduction of such contacts overlying gate electrodes by the previous removal of any silicon nitride film portions overlying gate electrodes at a specified part at which contact holes will be defined.

An explanation will now be given of the process flow in the manufacture of Embodiment 9 with reference to FIGS. 18a-18f below.

Figure 18A:
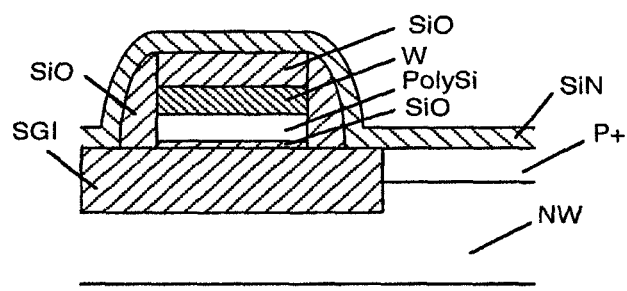
FIGS. 18a to 18f are diagrams illustrating in cross-section some of major process steps in the manufacture of a semiconductor device in accordance with Embodiment 9 of the invention.

After having fabricated a gate electrode and a diffusion layer P+, deposit a silicon nitride film SiN for use as an etch stopper (FIG. 18a). The gate electrode is a lamination of polycrystalline silicon PolySi and tungsten W, with an oxide film SiO being further multilayered thereon as a protective film.

Figure 18B:
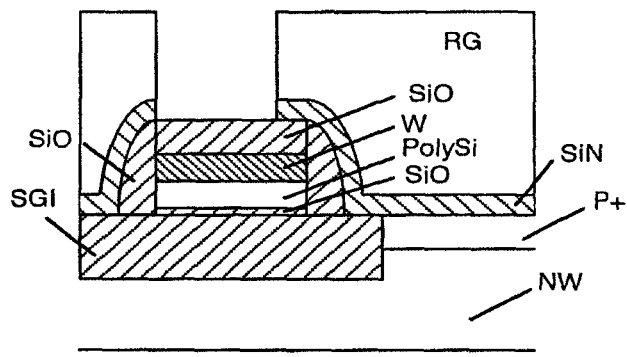

Remove by dry etching techniques a specified part of the silicon nitride film at locations for the definition of a contact hole overlying the gate electrode (FIG. 18b).

Figure 18C:
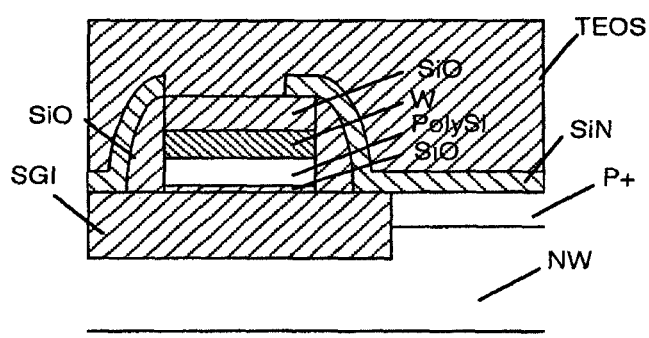
Figure 18D:
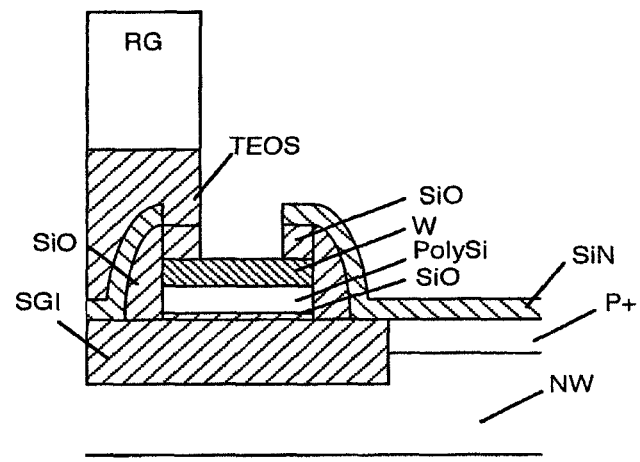

Deposit a TEOS film and others by plasma CVD methods to thereby form an interlayer dielectric film (FIG. 18c).

Let a selected portion of the oxide film at a contact opening portion be etched away by high selective dry etching techniques (FIG. 18d) Owing to such high selective etching, the silicon nitride film remains free from etch treatment and thus acts as a stopper. Since there is no stopper at the portion overlying the gate electrode from which the silicon nitride film has been removed in advance, this portion will be fully etched to the upper part of the gate electrode. This permits electrical conduction to occur also on the gate electrode.

Figure 18E:
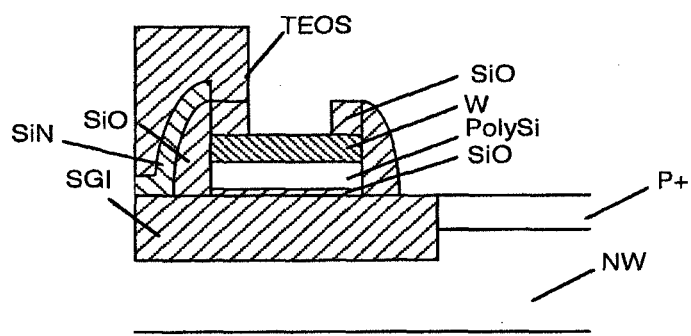

Remove the silicon nitride film by dry etching techniques (FIG. 18e).

Figure 18F:
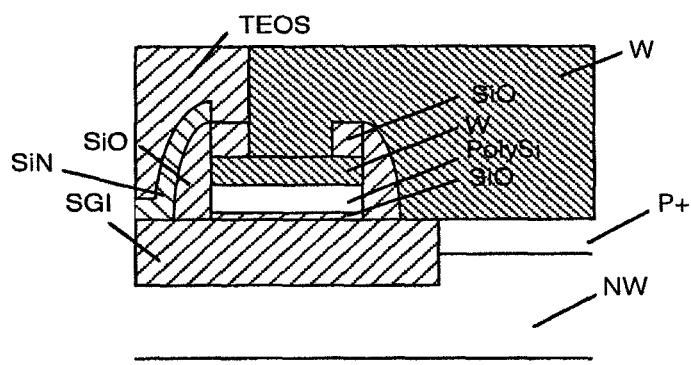

Deposit a chosen metal, such as tungsten in the resulting contact hole, thereby forming a buried plug (FIG. 18f).

Embodiment 10

Turning to FIGS. 19a-19g, a process flow in the manufacture of the three-layer contact section of Embodiment 10 is shown. Embodiment 10 is one example of the process for forming the three-layer contact section of Embodiments 1, 3-5 and 8.

A difference in the process flow of Embodiment 10 from that of Embodiment 9 is that more than one portion of the oxide film at a specified location at which a contact hole is to be opened over the gate electrode has been removed in advance prior to the deposition of a silicon nitride film to be used as the etch stopper.

The fabrication process flow of Embodiment 10 will be explained with reference to FIGS. 19a-19g below.

Figure 19A:
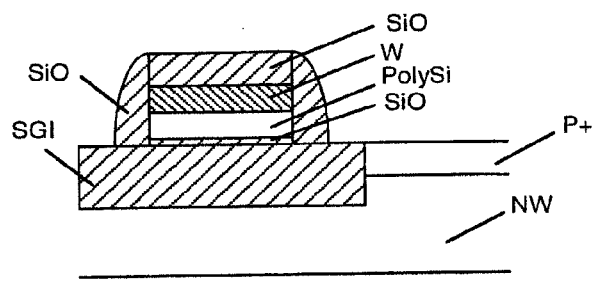
FIGS. 19a to 19g are diagrams illustrating in cross-section some of major process steps in the manufacture of a semiconductor device in accordance with Embodiment 10 of the invention.

Fabricate a gate electrode and a diffusion layer P+ (FIG. 19a). The gate electrode is a lamination of polycrystalline silicon PolySi and tungsten W, with an oxide film SiO further stacked thereon as a protective film.

Figure 19B:
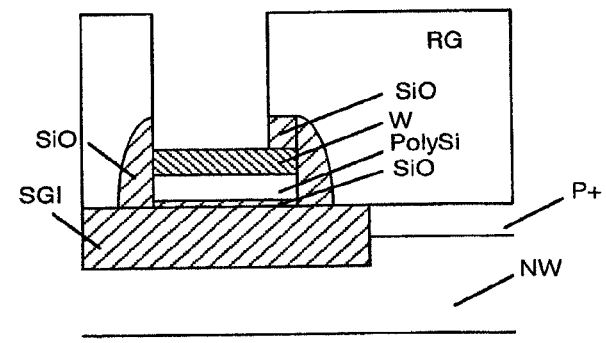

Remove by dry etching techniques a specified part of the silicon nitride film at the location for the definition of a contact hole overlying the gate electrode, thus letting the gate electrode be exposed at its upper part (FIG. 19b).

Figure 19C:
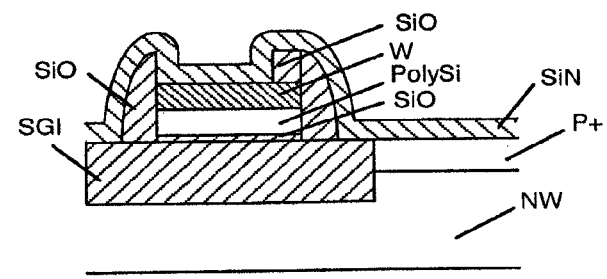

Deposit a silicon nitride film SiN as an etch stopper (FIG. 19c).

Figure 19D:
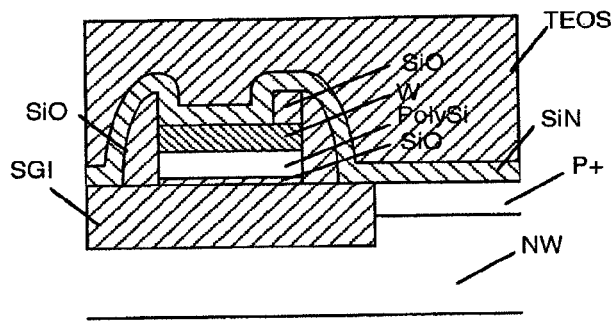
Figure 19E:
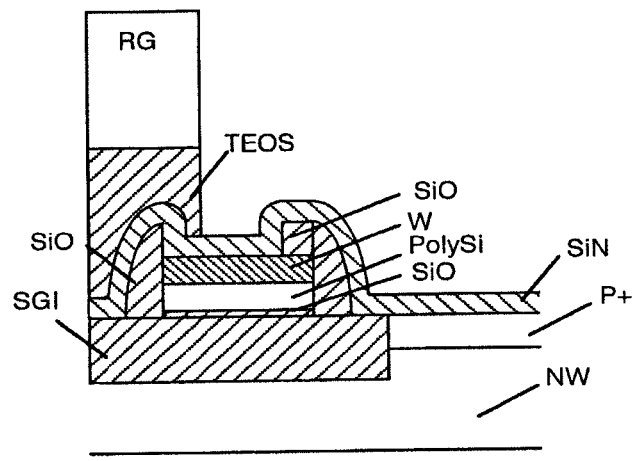
Figure 19F:
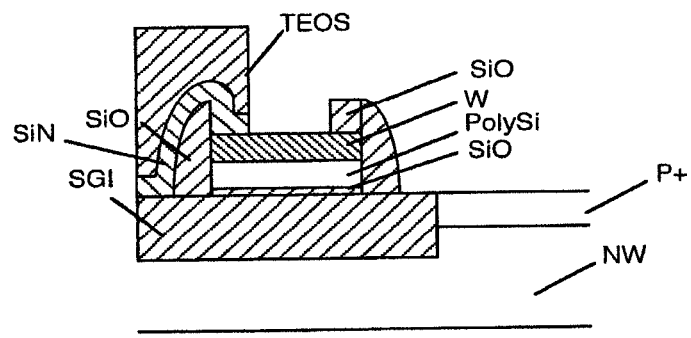

Deposit a TEOS film by plasma CVD methods to thereby form an interlayer dielectric film (FIG. 19d).

Let a portion of the oxide film at the contact opening portion be etched away by high selective dry etching techniques (FIG. 19e) Due to such high selective etching, the silicon nitride film remains free from etching treatment and thus acts as the stopper.

Remove the silicon nitride film by dry etching techniques (FIG. 19f) A certain portion from which the oxide film overlying the gate electrode has been removed prior to the deposition of the silicon nitride film is thus exposed at this time, which permits electrical conduction to occur also in the gate electrode.

Figure 19G:
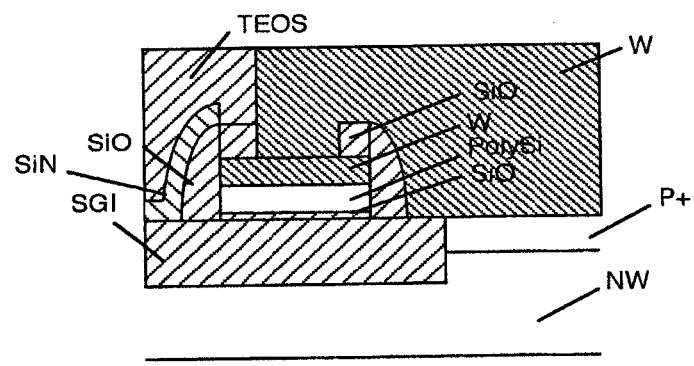

Deposit a chosen metal such as tungsten in the resultant contact hole, thereby forming a buried plug (FIG. 19g).

In accordance with the embodiments stated above, any diffusion layers used therein are specifically designed to have a simplified planar shape, excluding unnecessarily complicated shapes, which may in turn facilitate micro-patterning processes.

What is claimed is:

1. A semiconductor integrated circuit device provided with a plurality of lead layers over a semiconductor substrate, comprising:
    a plurality of first memory cells arranged along a first direction;
    a plurality of second memory cells arranged along the first direction;
    a first and a second bit lines each commonly connected to the plurality of first memory cells;
    a third and a fourth bit lines each commonly connected to the plurality of second memory cells;
    a plurality of word lines extending in a second direction, each of the plurality of word lines connected to one of the plurality of first memory cells and one of the plurality of second memory cells, respectively;
    a first, a second and a third P-well regions provided on a main surface of the semiconductor substrate;
    a first N-well region provided on the main surface of the semiconductor substrate and arranged between the first and second P-well regions;
    a second N-well region provided on the main surface of the semiconductor substrate and arranged between the second and third P-well regions;
    a first voltage supply lead comprised of a first lead layer of the plurality of the lead layers;
    a first supply path physically contacting a first portion of the first voltage supply lead opposite to the semiconductor substrate and supplying a first voltage to the first P-well region from the first voltage supply lead;
    a second supply path physically contacting a second portion of the first voltage supply lead, which is different from the first portion, opposite to the semiconductor substrate and supplying the first voltage to the second P-well region from the first voltage supply lead;
    a third supply path connecting to a third portion of the first voltage supply lead, which is different from the first and the second portions, opposite to the semiconductor substrate and supplying the first voltage to the third P-well region from the first voltage supply lead;
    a second voltage supply lead comprised of the first lead layer of the plurality of the lead layers;
    a fourth supply path physically contacting a fourth portion of the second voltage supply lead opposite to the semiconductor substrate and supplying a second voltage to the first N-well region from the second voltage supply lead; and
    a fifth supply path physically contacting a fifth portion of the second voltage supply lead, which is different from the fourth portion, opposite to the semiconductor substrate and supplying the second voltage to the second N-well region from the second voltage supply lead,
    wherein the first, the second, and the third portions are provided to be aligned linearly along the second direction in plan view,
    wherein the fourth and the fifth portions are provided to be aligned linearly along the second direction in plan view,
    wherein each of the plurality of first memory cells includes a first and a second P-channel transistors provided on the first N-well region,
    a first and a second N-channel transistors provided on the first P-well region, and
    a third and a fourth N-channel transistors provided on the second P-well;
    the first N-channel transistor and the first P-channel transistor configure a first inverter,
    the third N-channel transistor and the second P-channel transistor configure a second inverter with an input of the first inverter coupled to an output of the second inverter and with an output of the first inverter coupled to an input of the second inverter,
    the second N-channel transistor electrically connects the first bit line with the output of the first inverter, and
    the fourth N-channel transistor electrically connects the second bit line with the output of the second inverter with a gate of the fourth N-channel transistor coupled to a gate of the second N-channel transistor, and wherein each of the plurality of second memory cells includes a third and a fourth P-channel transistors provided on the second N-well region, a fifth and a sixth N-channel transistors provided on the second P-well region, and a seventh and an eighth N-channel transistors provided on the third P-well;

the fifth N-channel transistor and the third P-channel transistor configure a third inverter, the seventh N-channel transistor and the fourth P-channel transistor configure a fourth inverter with an input of the third inverter coupled to an output of the fourth inverter and with an output of the third inverter coupled to an input of the fourth inverter, the sixth N-channel transistor electrically connects the third bit line with the output of the third inverter, and the eighth N-channel transistor electrically connects the fourth bit line with the output of the fourth inverter with a gate of the eighth N-channel transistor couple to a gate of the sixth transistor.

2. The semiconductor integrated circuit device according to claim 1,
wherein the plurality of word lines are composed with the first lead layer.

3. The semiconductor integrated circuit device according to claim 1,
wherein the first and the second voltage supply lead is configured to extend in the second direction.

4. The semiconductor integrated circuit device according to claim 1,
wherein the first, the second, the third and the fourth bit lines are composed with a second lead layer of the plurality of lead layers which differs from the first lead layer.

5. The semiconductor integrated circuit device according to claim 1,
wherein the first and the second voltage supply lead crosses the first, the second, the third and the fourth bit lines in plan view.

6. The semiconductor integrated circuit device according to claim 5, wherein
the plurality of first memory cells includes a first group of plural memory cells and a second group of plural memory cells,
the plurality of second memory cells array includes a third group of plural memory cells and a fourth group of plural memory cells, and
the first and the second voltage supply lead, the first supply path, the second supply path and the first supply path are arranged between the first group and the second group and between the third group and the fourth group in plan view.

7. The semiconductor integrated circuit device according to claim 1,
wherein the first and the second voltage supply lead is provided over the first, the second and the third P-well regions and the first and the second N-well regions.

8. A semiconductor integrated circuit device provided with a plurality of lead layers over a semiconductor substrate, comprising:
a plurality of first memory cells arranged along a first direction;
a plurality of second memory cells arranged along the first direction;
a first and a second bit lines each commonly connected to the plurality of first memory cells;
a third and a fourth bit lines each commonly connected to the plurality of second memory cells;
a plurality of word lines extending in a second direction, each of the plurality of word lines connected to one of the plurality of first memory cells and one of the plurality of second memory cells, respectively;
a first, a second and a third P-well regions provided on a main surface of the semiconductor substrate;
a first N-well region provided on the main surface of the semiconductor substrate and arranged between the first and second P-well regions;
a second N-well region provided on the main surface of the semiconductor substrate and arranged between the second and third P-well regions;
a first voltage supply lead composed with a first lead layer of the plurality of the wiring lead layers;
a first supply path physically contacting a first portion of the first voltage supply lead opposite to the semiconductor substrate and supplying a first voltage to the first P-well region from the first voltage supply lead;
a second supply path physically contacting a second portion of the first voltage supply lead, which is different from the first portion, opposite to the semiconductor substrate and supplying the first voltage to the second P-well region from the first voltage supply lead;
a third supply path connecting to a third portion of the first voltage supply lead, which is different from the first portion and the second portion, opposite to the semiconductor substrate and supplying the first voltage to the third P-well region from the first voltage supply lead;
a second voltage supply lead comprised of the first lead layer of the plurality of the lead layers;
a fourth supply path physically contacting a fourth portion of the second voltage supply lead opposite to the semiconductor substrate and supplying a second voltage to the first N-well region from the second voltage supply lead; and
a fifth supply path physically contacting a fifth portion of the second voltage supply lead, which is different from the fourth portion, opposite to the semiconductor substrate and supplying the second voltage to the second N-well region from the second voltage supply lead;
wherein the first voltage supply lead comprises an area continuously formed between the first portion and the third portion in plan view, and the second portion is provided in the area,
wherein the second voltage supply lead comprises an area continuously formed between the fourth portion and the fifth portion in plan view,
wherein each of the plurality of first memory cells includes:
a first and a second P-channel transistors provided on the first N-well region,
a first and a second N-channel transistors provided on the first P-well region, and
a third and a fourth N-channel transistors provided on the second P-well;
the first N-channel transistor and the first P-channel transistor configure a first inverter;
the third N-channel transistor and the second P-channel transistor configure a second inverter with an input of the first inverter coupled to an output of the second inverter and with an output of the first inverter coupled to an input of the second inverter;

the second N-channel transistor electrically connects the first bit line with the output of the first inverter;

the fourth N-channel transistor electrically connects the second bit line with the output of the second inverter with a gate of the fourth N-channel transistor coupled to a gate of the second N-channel transistor, and wherein each of the plurality of second memory cells includes a third and a fourth P-channel transistors provided on the second N-well region, a fifth and a sixth N-channel transistors provided on the second P-well region, and a seventh and an eighth N-channel transistors provided on the third P-well, the fifth N-channel transistor and the third P-channel transistor configure a third inverter;

the seventh N-channel transistor and the fourth P-channel transistor configure a fourth inverter with an input of the third inverter coupled to an output of the fourth inverter and with an output of the third inverter coupled to an input of the fourth inverter;

the sixth N-channel transistor electrically connects the third bit line with the output of the third inverter, and the eighth N-channel transistor electrically connects the fourth bit line with the output of the fourth inverter with a gate of the eighth N-channel transistor coupled to a gate of the sixth N-channel transistor.

9. The semiconductor integrated circuit device according to claim 8,
wherein the plurality of word lines are composed with the first lead layer.

10. The semiconductor integrated circuit device according to claim 8,
wherein the voltage supply lead is configured to extend in the second direction.

11. The semiconductor integrated circuit device according to claim 8,
wherein the first, the second, the third and the fourth bit lines are composed with a second wiring lead of the plurality of lead layers which differs from the first lead layer.

12. The semiconductor integrated circuit device according to claim 8,
wherein the voltage supply lead crosses the first, the second, the third and the fourth bit lines in plan view.

13. The semiconductor integrated circuit device according to claim 12, wherein
the plurality of first memory cells includes a first group of plural memory cells and a second group of plural memory cells,
the plurality of second memory cells includes a third group of plural memory cells and a fourth group of plural memory cells, and
the voltage supply lead, the first supply path, the second supply path and the first supply path are arranged between the first group and the second group and between the third group and the fourth group in plan view.

14. The semiconductor integrated circuit device according to claim 8,
wherein the voltage supply lead is provided over the first, the second and the third P-well regions and the first and the second N-well regions.

15. A semiconductor integrated circuit device provided with a plurality of lead layers over a semiconductor substrate, comprising:
a plurality of first memory cells arranged along a first direction;

a plurality of second memory cells arranged along the first direction;

a first and a second bit lines each commonly connected to the plurality of first memory cells;

a third and a fourth bit lines each commonly connected to the plurality of second memory cells;

a plurality of word lines extending in a second direction, each of the plurality of word lines connected to one of the plurality of first memory cells and one of the plurality of second memory cells, respectively;

a first, a second and a third P-well regions provided on a main surface of the semiconductor substrate;

a first N-well region provided on the main surface of the semiconductor substrate and arranged between the first and second P-well regions;

a second N-well region provided on the main surface of the semiconductor substrate and arranged between the second and third P-well regions;

a first voltage supply lead composed with one lead layer of the plurality of the wiring lead layers;

a first supply path physically contacting a first portion of the first voltage supply lead opposite to the semiconductor substrate and supplying a first voltage to the first P-well region from the voltage supply lead;

a second supply path physically contacting a second portion of the first voltage supply lead, which is different from the first portion, opposite to the semiconductor substrate and supplying the first voltage to the second P-well region from the first voltage supply lead;

a third supply path connecting to a third portion of the first voltage supply lead, which is different from the first portion and the second portion, opposite to the semiconductor substrate and supplying the first voltage to the third P-well region from the first voltage supply lead, a second voltage supply lead comprised of the first lead layer of the plurality of the lead layers;

a fourth supply path physically contacting a fourth portion of the second voltage supply lead opposite to the semiconductor substrate and supplying a second voltage to the first N-well region from the second voltage supply lead; and a fifth supply path physically contacting a fifth portion of the second voltage supply lead, which is different from the fourth portion, opposite to the semiconductor substrate and supplying the second voltage to the second N-well region from the second voltage supply lead;

wherein the first voltage supply lead comprises one continuously formed area in plan view, wherein the first, the second and the third portions are disposed in the area, wherein the second voltage supply lead comprises one continuously formed area in plan view, in which the fourth and the fifth portions are disposed, wherein each of the plurality of first memory cells includes
a first and a second P-channel transistors provided on the first N-well region, a first and a second N-channel transistors provided on the first P-well region, and a third and a fourth N-channel transistors provided on the second P-well;

respective drains of the first N-channel transistor and the first P-channel transistor and respective gates of the third N-channel transistor and the second P-channel transistor are coupled at a first connection node while respective drains of the third N-channel transistor and the second P-channel transistor and respective gates of the first N-channel transistor and the first P-channel transistor are coupled at a second connection node, the second N-channel transistor electrically connects the first bit line at the first connection node, the fourth N-channel transistor electrically connects the second bit line with the second connect node with a gate of the fourth N-channel transistor coupled to a gate of the second N-channel transistor, wherein each of the plurality of second memory cells includes a third and a fourth P-channel transistors provided on the second N-well region, a fifth and a sixth N-channel transistors provided on the second P-well region, and a seventh and an eighth N-channel transistors provided on the third P-well, respective drains of the fifth N-channel transistor and the third P-channel transistor and respective gates of the seventh N-channel transistor and the fourth P-channel transistor are coupled at a third connection node while respective drains of the seventh N-channel transistor and the fourth P-channel transistor and respective gates of the fifth N-channel transistor and the third P-channel transistor are coupled at a fourth connection node, the sixth N-channel transistor electrically connects the third bit line at the third connection node, the eighth N-channel transistor electrically connects the fourth bit line with the fourth connection node with a gate of the eighth N-channel transistor coupled to a gate of the sixth N-channel transistor.

16. The semiconductor integrated circuit device according to claim 15, wherein the plurality of word lines are composed with the same lead layer as the first and the second voltage supply lead.

17. The semiconductor integrated circuit device according to claim 15, wherein the one continuously formed area of the first voltage supply lead has a portion extending in the second direction, and wherein the one continuously formed area of the second voltage supply lead has a portion extending in the second direction.

18. The semiconductor integrated circuit device according to claim 15, wherein the first, the second, the third and the fourth bit lines are composed with another wiring lead of the plurality of lead layers which differs from the one lead layer.

19. The semiconductor integrated circuit device according to claim 15, wherein the first and the second voltage supply lead crosses the first, the second, the third and the fourth bit lines in plan view.

20. The semiconductor integrated circuit device according to claim 19, wherein the plurality of first memory cells includes a first group of plural memory cells and a second group of plural memory cells, the plurality of second memory cells includes a third group of plural memory cells and a fourth group of plural memory cells, and the first voltage supply lead, the first supply path, the second supply path and the third supply path are arranged between the first group and the second group and between the third group and the fourth group in plan view.

21. The semiconductor integrated circuit device according to claim 15, wherein the one continuously formed area of the first and the second voltage supply lead is provided over the first, the second and the third P-well regions and the first and the second N-well regions.

* * * * *